United States Patent
Sriraman et al.

(10) Patent No.: US 9,275,869 B2
(45) Date of Patent: Mar. 1, 2016

(54) FAST-GAS SWITCHING FOR ETCHING

(71) Applicant: Lam Research Corporation, Fremont, CA (US)

(72) Inventors: Saravanapriyan Sriraman, Fremont, CA (US); Alexander Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 245 days.

(21) Appl. No.: 13/958,239

(22) Filed: Aug. 2, 2013

(65) Prior Publication Data

US 2015/0037981 A1  Feb. 5, 2015

(51) Int. Cl.
*H01L 21/3065* (2006.01)
*H01L 21/3213* (2006.01)
*H01J 37/32* (2006.01)

(52) U.S. Cl.
CPC ....... *H01L 21/3065* (2013.01); *H01J 37/32449* (2013.01); *H01L 21/32137* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 5,888,907 A * | 3/1999 | Tomoyasu et al. | 438/714 |
| 6,165,311 A * | 12/2000 | Collins et al. | 156/345.26 |
| 6,287,980 B1 * | 9/2001 | Hanazaki et al. | 438/726 |
| 6,784,108 B1 * | 8/2004 | Donohoe et al. | 438/706 |
| 7,371,332 B2 | 5/2008 | Larson et al. | |
| 7,708,859 B2 * | 5/2010 | Huang et al. | 156/345.34 |
| 8,137,463 B2 * | 3/2012 | Liu et al. | 118/715 |
| 8,313,611 B2 | 11/2012 | Larson | |
| 8,703,619 B2 * | 4/2014 | Araki et al. | 438/706 |
| 8,808,561 B2 * | 8/2014 | Kanarik | 216/67 |
| 8,877,000 B2 * | 11/2014 | Strang | 156/345.26 |
| 8,883,028 B2 * | 11/2014 | Kanarik | 216/68 |
| 2007/0187363 A1 * | 8/2007 | Oka et al. | 216/59 |
| 2009/0260763 A1 * | 10/2009 | Kiehlbauch | 156/345.43 |
| 2010/0041238 A1 | 2/2010 | Cooperberg et al. | |
| 2011/0318930 A1 * | 12/2011 | Jeon et al. | 438/695 |

* cited by examiner

*Primary Examiner* — Anita Alanko
(74) *Attorney, Agent, or Firm* — Beyer Law Group LLP

(57) ABSTRACT

A method for etching a layer in a plasma chamber with an inner injection zone gas feed and an outer injection zone gas feed is provided. The layer is placed in the plasma chamber. A pulsed etch gas is provided from the inner injection zone gas feed at a first frequency, wherein flow of pulsed etch gas from the inner injection zone gas feed is ramped down to zero. The pulsed etch gas is provided from the outer injection zone gas feed at the first frequency and simultaneous with and out of phase with the pulsed etch gas from the inner injection zone gas feed. The etch gas is formed into a plasma to etch the layer, simultaneous with the providing the pulsed etch gas from the inner injection zone gas feed and providing the pulsed gas from the outer interjection zone gas feed.

16 Claims, 6 Drawing Sheets

FAST-GAS SWITCHING FOR ETCHING

BACKGROUND OF THE INVENTION

The present invention relates to the formation of semiconductor devices. More specifically, the invention relates to the formation of semiconductor devices require etching features.

During semiconductor wafer processing during an etch different plasma processes may be used.

SUMMARY OF THE INVENTION

To achieve the foregoing and in accordance with the purpose of the present invention, a method of for etching a layer in a plasma chamber with an inner injection zone gas feed and an outer injection zone gas feed is provided. The layer is placed in the plasma chamber. A pulsed etch gas is provided from the inner injection zone gas feed at a first frequency, wherein flow of pulsed etch gas from the inner injection zone gas feed is ramped down to zero during providing the pulsed etch gas from the inner injection zone gas feed. The pulsed etch gas is provided from the outer injection zone gas feed at the first frequency and simultaneous with and out of phase with the pulsed etch gas from the inner injection zone gas feed, wherein the outer injection zone surrounds the inner injection zone, wherein flow of pulsed etch gas from the outer injection zone gas feed is ramped down to zero during providing the pulsed etch gas from the outer injection zone gas feed at the first frequency. The etch gas is formed into a plasma to etch the layer, simultaneous with the providing the pulsed etch gas from the inner injection zone gas feed and providing the pulsed gas from the outer interjection zone gas feed.

In another manifestation of the invention, a method of for etching a layer in a plasma chamber with an inner injection zone gas feed and an outer injection zone gas feed is provided. The layer is placed in the plasma chamber. A pulsed etch gas is provided from the inner injection zone gas feed at a first frequency. The pulsed etch gas is provided from the outer injection zone gas feed at the first frequency and simultaneous and out of phase with the pulsed etch gas from the inner injection zone gas feed. The etch gas is formed into a plasma to etch the layer, simultaneous with the providing the pulsed etch gas from the inner injection zone gas feed and providing the pulsed gas from the outer interjection zone gas feed.

In another manifestation of the invention, an apparatus for etching an etch layer on a wafer is provided. A plasma processing chamber, comprising chamber wall forming a plasma processing chamber enclosure. A substrate support supports a wafer within the plasma processing chamber enclosure. A pressure regulator regulates the pressure in the plasma processing chamber enclosure. At least one electrode provides power to the plasma processing chamber enclosure for sustaining a plasma. An inner injection zone gas feed provides gas into the plasma processing chamber enclosure. An outer injection zone gas feed surrounding the inner injection zone gas feed provides gas into the plasma processing enclosure. A gas outlet for exhausts gas from the plasma processing chamber enclosure. At least one RF power source is electrically connected to the at least one electrode. A gas source is provided. A switch with a switching speed of at least 1 Hz is in fluid connection between the gas source and the inner injection zone gas feed and the outer injection zone gas feed, wherein the switch is able to provide a pulsed gas to the inner injection zone gas feed at a first frequency and is able to provide the pulsed gas to the outer injection zone gas feed at the first frequency and out of phase with providing the pulsed gas to the inner injection zone gas feed.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
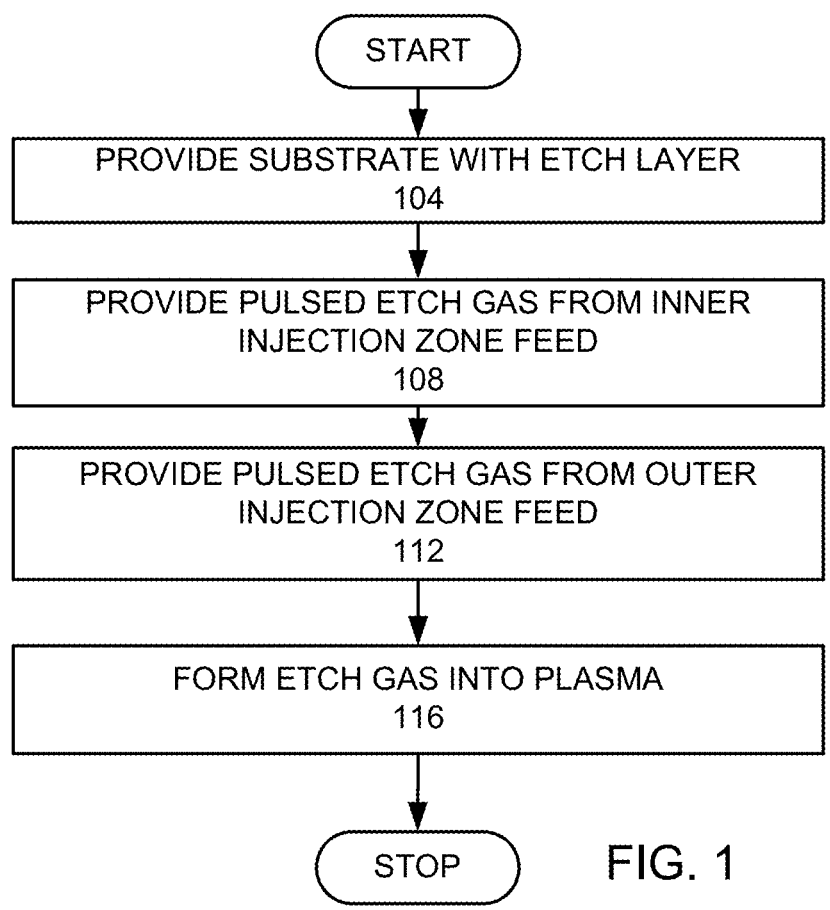
FIG. 1 is a high level flow chart of a process that may be used in an embodiment of the invention.

To facilitate understanding, FIG. 1 is a high level flow chart of a process that may be used in an embodiment of the invention which etches features. A substrate is provided with an etch layer (step 104). An etch gas is pulsed from an inner injection zone gas feed at a first frequency (step 108). An etch gas is pulsed from an outer injection zone gas feed at the first frequency and out of phase with the pulsed etch gas from the inner injection zone gas feed (step 112). The etch gas is formed into a plasma (step 116).

EXAMPLE

Figure 2A:
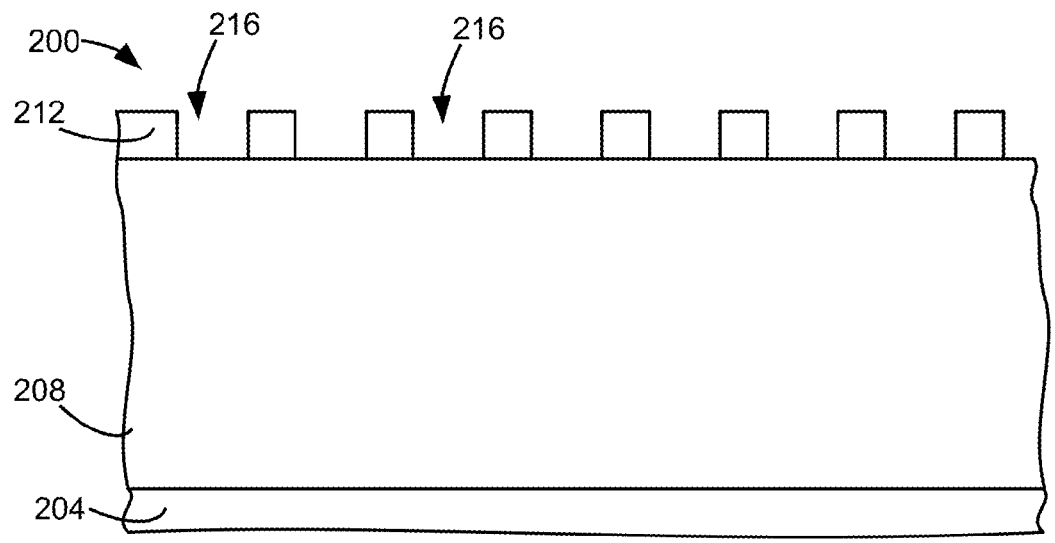
FIGS. 2A-B are schematic cross-sectional views of a stack processed according to an embodiment of the invention.

In an example of an implementation of the invention, a substrate is provided with an etch layer under a mask with features into a plasma processing device (step 104). FIG. 2A is a cross sectional view of a stack 200 with a substrate 204 disposed below an etch layer 208, disposed below a patterned mask 212 with features 216. In this example, the etch layer 208 is silicon. The etch layer 208 may be a silicon layer, such as polysilicon, deposited on the substrate 204, or may be part of the substrate 204. The patterned mask 212 is formed from silicon oxide. In various embodiments, one or more layers may be placed between the various layers. For example, one or more layers, such as an etch stop layer, may be between the etch layer 208 and the substrate 204.

Figure 3:
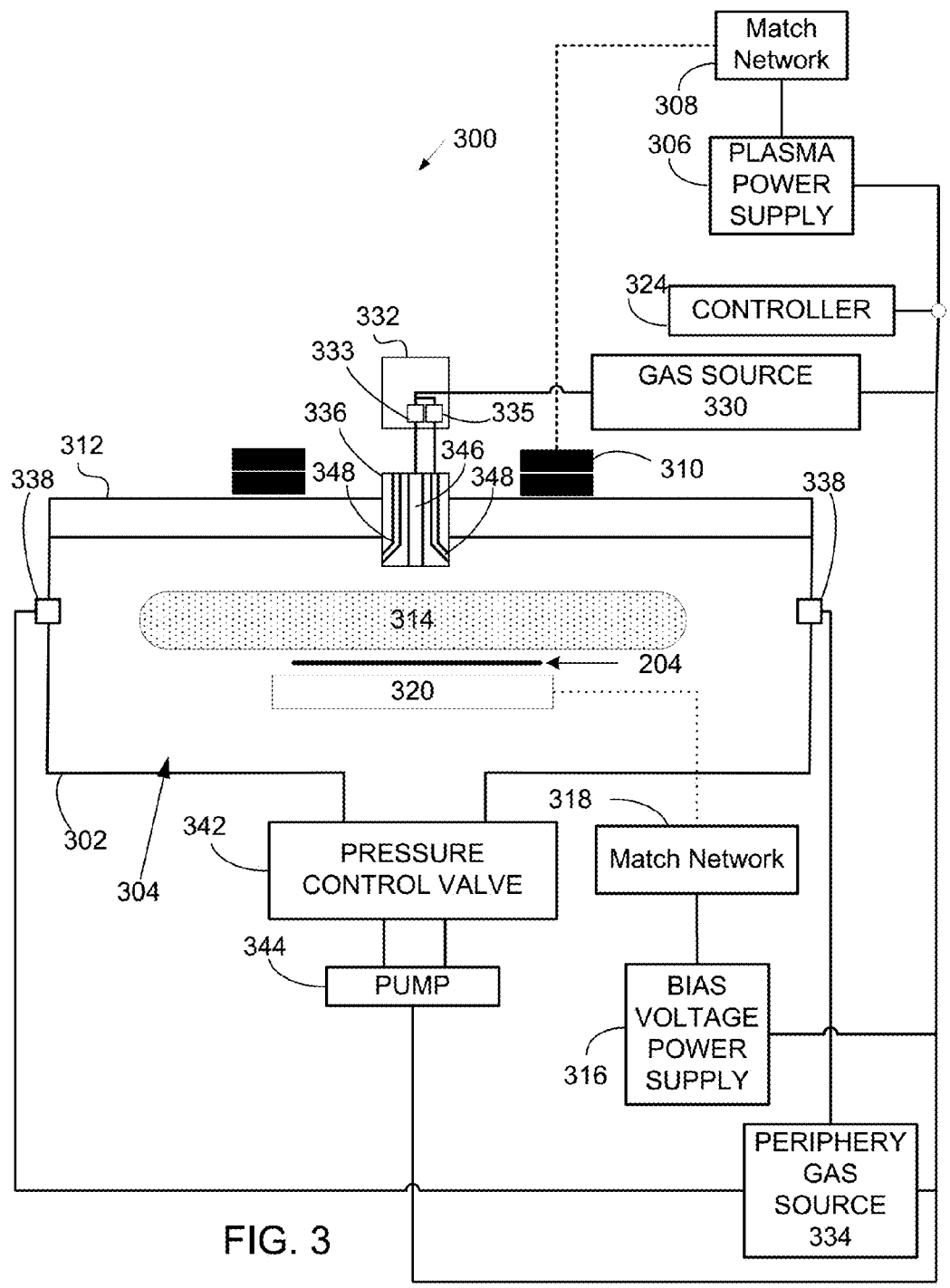
FIG. 3 is a schematic view of a plasma processing chamber that may be used in practicing the invention.

FIG. 3 schematically illustrates an example of a plasma processing system 300 which may be used to perform the process of etching the etch layer 208 in accordance with one embodiment of the present invention. The plasma processing system 300 includes a plasma reactor 302 having a plasma processing chamber 304 therein. A plasma power supply 306, tuned by a match network 308, supplies power to a TCP coil 310 located near a power window 312 to create a plasma 314 in the plasma processing chamber 304 by providing an inductively coupled power. The TCP coil (upper power source) 310 may be configured to produce a uniform diffusion profile within the plasma processing chamber 304. For example, the TCP coil 310 may be configured to generate a toroidal power distribution in the plasma 314. The power window 312 is provided to separate the TCP coil 310 from the plasma processing chamber 304 while allowing energy to pass from the TCP coil 310 to the plasma processing chamber 304. A wafer bias voltage power supply 316 tuned by a match network 318 provides power to an electrode 320 to set the bias voltage on the substrate 204 which is supported by the electrode 320. A controller 324 sets points for the plasma power supply 306 and the wafer bias voltage power supply 316.

The plasma power supply 306 and the wafer bias voltage power supply 316 may be configured to operate at specific radio frequencies such as, for example, 13.56 MHz, 27 MHz, 2 MHz, 400 kHz, or combinations thereof. Plasma power supply 306 and wafer bias voltage power supply 316 may be appropriately sized to supply a range of powers in order to achieve desired process performance. For example, in one embodiment of the present invention, the plasma power supply 306 may supply the power in a range of 50 to 5000 Watts, and the wafer bias voltage power supply 316 may supply a bias voltage of in a range of 20 to 2000 V. In addition, the TCP coil 310 and/or the electrode 320 may be comprised of two or more sub-coils or sub-electrodes, which may be powered by a single power supply or powered by multiple power supplies.

As shown in FIG. 3, the plasma processing system 300 further includes a gas source/gas supply mechanism 330. The gas source/gas supply mechanism 330 provides gas to a switch 332, which supplies gas to a gas feed 336 in the form of a nozzle. The gas feed 336 has an inner passage 346 and outer passages 348. In this embodiment, eight outer passages 348 surround the inner passage 346. In this embodiment, the switch 332 is a fast switch which is able to provide pulses of gas to the inner and outer passages 346, 348 at a frequency of at least 1 Hz. In this embodiment the switch 332 comprises an inner switch 333, which supplies a gas to the inner passage 346, and an outer switch 335, which supplies a gas to the outer passages 348. In another embodiment, sub-switches are not used to control the pulsing of gas to the inner passage 346 and the outer passages 348, so that the switch 332 switches the flow of the gas from the inner passage 346 to the outer passage 348 and back. In this embodiment, a periphery gas source 334 provides gas to periphery gas inlets 338. The process gases and byproducts are removed from the plasma processing chamber 304 via a pressure control valve 342 and a pump 344, which also serve to maintain a particular pressure within the plasma processing chamber 304. The gas source/gas supply mechanism 330 and periphery gas source 334 are controlled by the controller 324. A modified Kiyo by Lam Research Corp. of Fremont, Calif., may be used to practice an embodiment of the invention.

Figure 4:
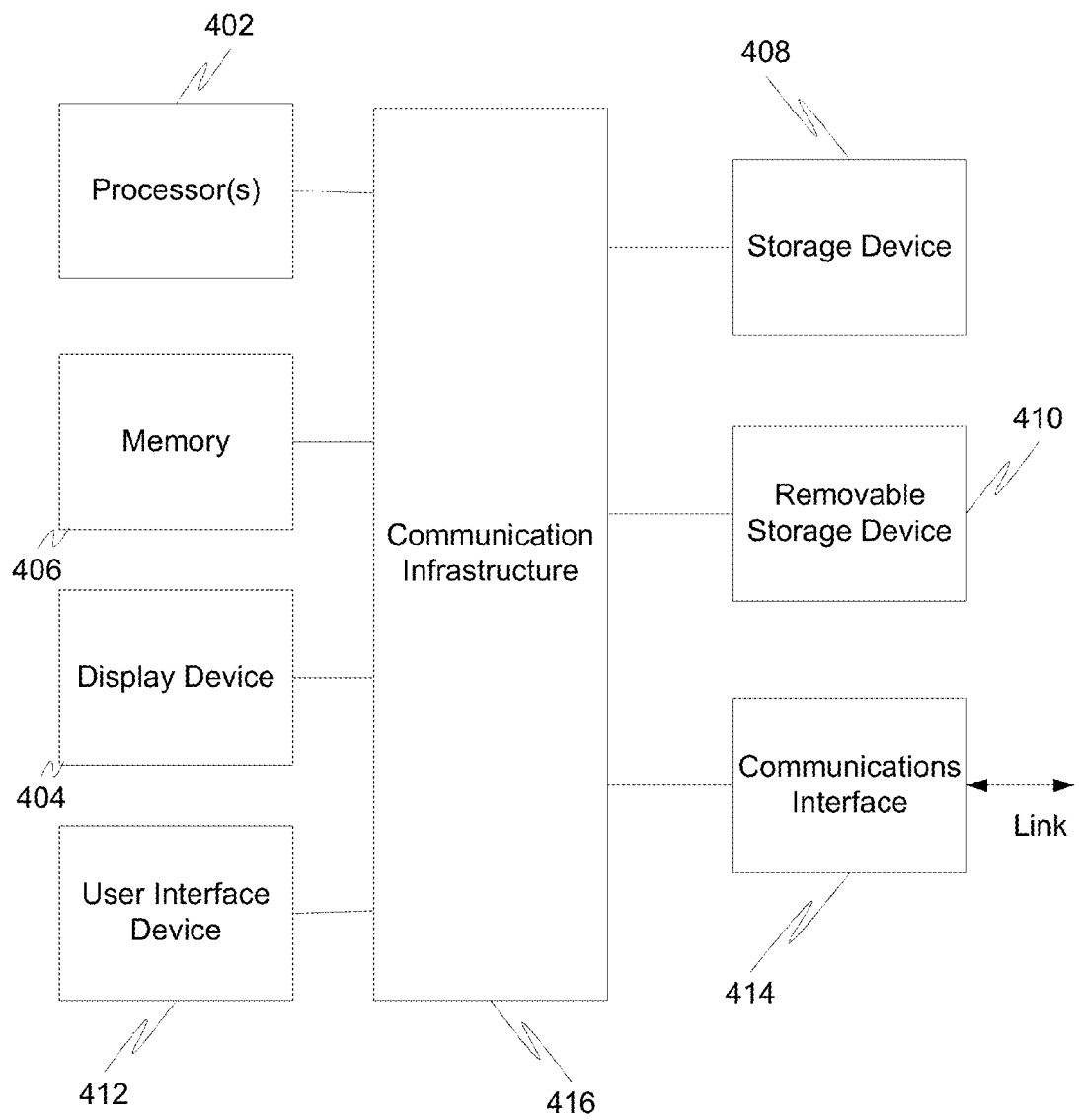
FIG. 4 illustrates a computer system, which is suitable for implementing a controller used in embodiments of the present invention.

FIG. 4 is a high level block diagram showing a computer system 400, which is suitable for implementing a controller 324 used in embodiments of the present invention. The computer system may have many physical forms ranging from an integrated circuit, a printed circuit board, and a small hand-held device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 5A:
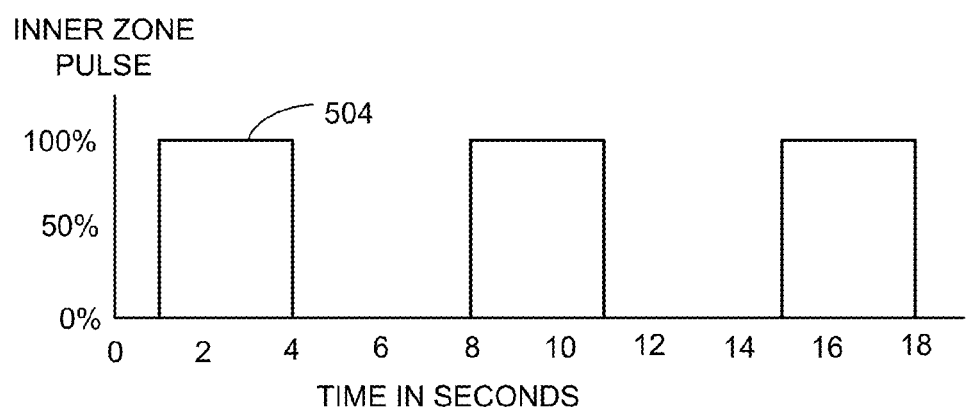
FIGS. 5A-B are graphs of the etch gas pulses.

Etch gas is pulsed from the inner injection zone gas feed at a first frequency (step 108). In this example the etch gas is 200 sccm $Cl_2$ (Chlorine). A chamber pressure is set at 20 mT. In other embodiments, the pressure chamber may range from sub-milliTorr to 1 Torr (0.1 mT to 1 Torr). In other embodiments, the etch gas comprises a halogen containing component or a fluorocarbon containing component. In this embodiment, the inner injection zone gas feed is the outlet of the inner passage 346. FIG. 5A is a graph of pulsing of the inner injection zone gas feed. In this example, the pulse 504 for the inner injection zone gas feed begins at 1 second and lasts for 3 seconds before the flow is reduced to 0%. The flow again begins at 8 seconds and lasts for 3 seconds. Therefore, the pulse 504 for the inner injection zone gas feed has a period of 7 seconds with a frequency of $1/7$ Hz and a duty cycle of $3/7$ or about 43%.

Figure 5B:
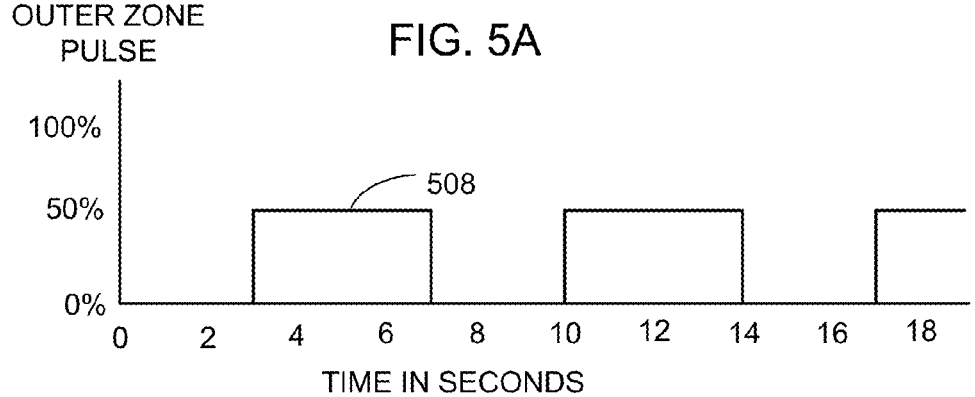

The etch gas is pulsed from the outer injection zone gas feed (step 112). Preferably the etch gas is pulsed from the outer injection zone gas feed at the first frequency and out of phase with the pulsed etch gas from the inner injection zone gas feed. In this embodiment, the outer injection zone gas feed is the outlet of the outer passages 348. FIG. 5B is a graph of pulsing of the outer injection zone gas feed. In this example, the pulse 508 for the inner injection zone gas feed begins at 3 seconds at 50% and lasts for 4 seconds before the flow is reduced to 0%. The flow again begins at 10 seconds and lasts for 4 seconds. Therefore, the pulse 508 for the inner injection zone gas feed has a period of 7 seconds with a frequency of $1/7$ Hz and a duty cycle of $4/7$ or about 57%. In this example, the pulse 504 for the inner injection zone gas feed and the pulse 508 for the outer injection zone gas feed overlap for 1 second. In addition, there is a 1 second period between the end of the pulse 508 for the outer injection zone gas feed and the beginning of the pulse 504 for the inner injection zone gas feed. FIGS. 5A-B show that the pulsed etch gas from the outer injection zone gas feed at the first frequency pulsed simultaneously with and out of phase with the pulsed etch gas from the inner injection zone gas feed.

Figure 2B:
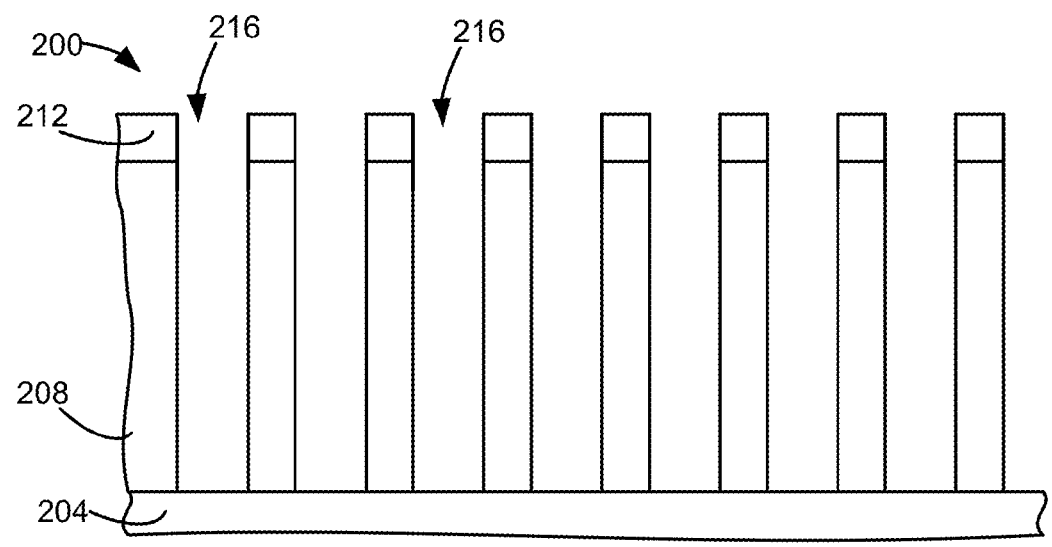

The etch gas is formed into a plasma (step 116). In this example, TCP power is provided in a range of 1 W-4000 W. A bias voltage is provided in a range from 0 V-3000 V. The forming the etch gas into a plasma is simultaneous with the providing the pulsed etch gas from the inner injection zone gas feed and providing the pulsed gas from the outer interjection zone gas feed. FIG. 2B is a cross-sectional view of the stack 200 after features 216 are completely etched.

This embodiment provides a steady and constant etch gas that is pulsed out of phase between the inner injection zone gas feed and the outer injection zone gas feed. Allowing for independent duty cycles, while maintaining the same frequency with a different phase allows additional tuning knobs to provide a more uniform etch across the surface of the substrate. Preferably, the pulsing causes the flow to the inner injection zone gas feed and the outer injection zone gas feed to ramp down to zero.

Figure 6:
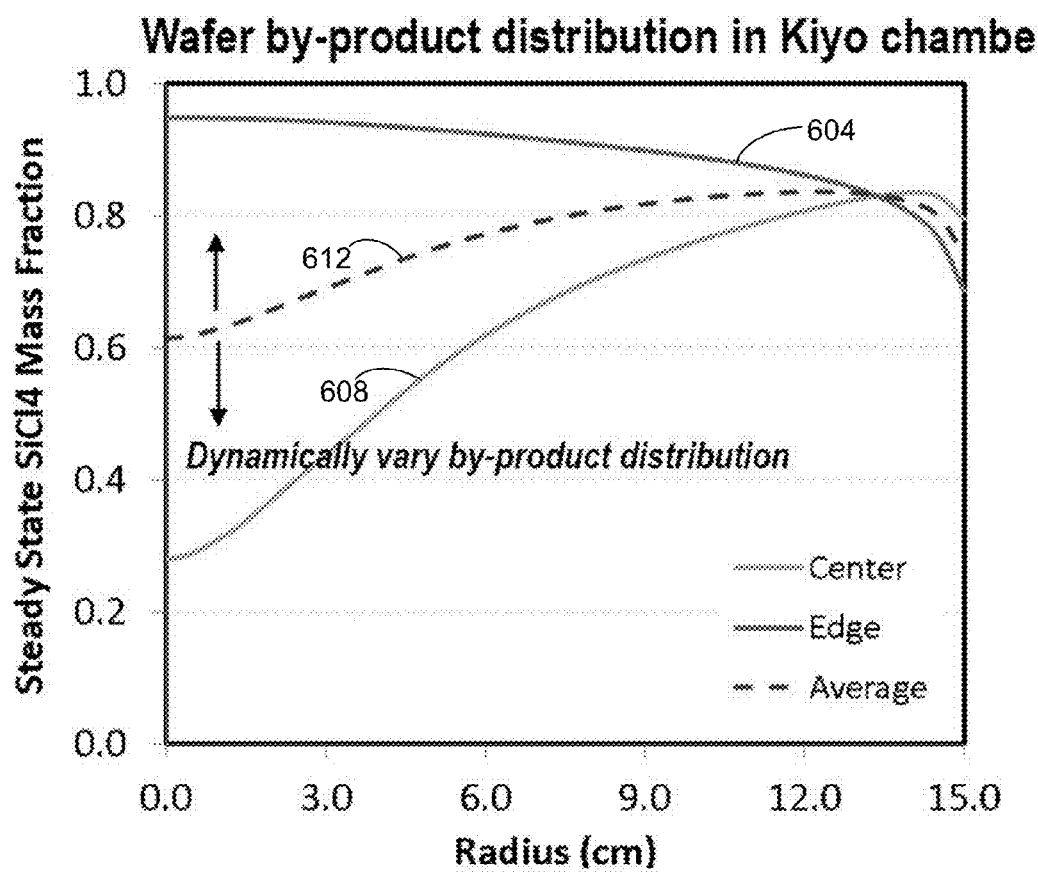
FIG. 6 is a graph of a wafer by-product distribution.

FIG. 6 is a graph of a wafer by-product distribution in a Kiyo chamber graphing steady state $SiCl_4$ mass fraction versus distance in cm from the center of the substrate. Curve 604 is the resulting wafer by-product distribution, if the etch gas was supplied only to the inner injection zone only through the inner passage 346. The $SiCl_4$ mass fraction is almost 1.0 near the center, dropping to about 0.6 at 15.0 cm from the center. This results in about a 40% difference in the $SiCl_4$ mass fraction between the center and edge of the substrate. Curve 608 is the resulting wafer by-product distribution, if the etch gas was supplied only to the outer injection zone only through the outer passages 348. The $SiCl_4$ mass fraction is about 0.3 near the center, rising to about 0.8 at 15.0 cm from the center. This results in more than a 100% difference in the $SiCl_4$ mass fraction between the center and edge of the substrate. Curve 612 is the average of curve 604 and 608, which would be provided by alternating pulses to the inner injection zone and the outer injection zone with equal duty cycles. The $SiCl_4$ mass fraction is about 0.6 near the center, rising to about 0.7 at 15.0 cm from the center. This results in about a 17% difference in the $SiCl_4$ mass fraction between the center and edge of the substrate. This lower percent different in the $SiCl_4$ mass fraction between the center and edge of the substrate indicates a more uniform etch across the entire surface of the wafer. In a gas-pulsed process, by-products can be pumped out in between gas flow events before initiating the next reaction sequence. In contrast, in a continuous gas flow method even with both zones operational, the reactants and by-products are always in interaction during the entire process, which may be detrimental.

In this embodiment, the inner injection zone gas feed is above a center of the layer and directs the etch gas directly towards the center of the layer, and the outer injection zone gas feed directs the etch gas at an acute angle with respect to the layer, as shown in FIG. 3. In addition, in this embodiment, the outer injection zone gas feed directs the etch gas away from the center of the layer.

In other embodiments of the invention, the periphery gas inlets 338 may be used as the outer injection zone gas feed and the inner passage 346 and/or outer passages 348 form the inner injection zone gas feed. In another embodiment, both the periphery gas inlets 338 and the outer passages 348 form the outer injection zone gas feed and the inner passage 346 forms the inner injection zone gas feed. In these embodiments, the outer injection zone surrounds the inner injection zone.

In another embodiment, the inner passage 346 forms the inner injection zone gas feed, the outer passages 348 form the outer injection zone gas feed, and the periphery gas inlets 338 provide a tuning gas. The tuning gas may be pulsed. In one embodiment, the frequency of the pulse of the tuning gas is different than the frequency of the pulse of the etching gas. In another embodiment, the frequency of the pulse of the tuning gas is equal to the frequency of the pulse of the etching gas. In another embodiment, the periphery gas inlets 338 are not used or are not present.

Although the preferred embodiment uses an inductive coupling for energizing the plasma, other embodiments may use other methods, such as capacitive coupling to energize the plasma. In other embodiments, the nozzle may be replaced by a shower head. In other embodiments, the pulses are not square wave pulses.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method of for etching a layer in a plasma chamber with an inner injection zone gas feed and an outer injection zone gas feed, comprising:

placing the layer in the plasma chamber;

providing a pulsed etch gas from the inner injection zone gas feed at a first frequency, wherein flow of pulsed etch gas from the inner injection zone gas feed ramps down to zero during providing the pulsed etch gas from the inner injection zone gas feed;

providing the pulsed etch gas from the outer injection zone gas feed at the first frequency and simultaneous with and out of phase with the pulsed etch gas from the inner injection zone gas feed, wherein the outer injection zone surrounds the inner injection zone, wherein flow of pulsed etch gas from the outer injection zone gas feed ramps down to zero during providing the pulsed etch gas from the outer injection zone gas feed at the first frequency; and forming the etch gas into a plasma to etch the layer, simultaneous with the providing the pulsed etch gas from the inner injection zone gas feed and providing the pulsed gas from the outer interjection zone gas feed, wherein the inner injection zone gas feed is above a center of the layer and wherein the inner injection zone gas feed directs the etch gas directly towards the center of the layer, and wherein the outer injection zone gas feed directs the etch gas at an acute angle with respect to the layer.

2. A method of for etching a layer in a plasma chamber with an inner injection zone gas feed and an outer injection zone gas feed, comprising:

placing the layer in the plasma chamber;

providing a pulsed etch gas from the inner injection zone gas feed at a first frequency;

providing the pulsed etch gas from the outer injection zone gas feed at the first frequency and simultaneous and out of phase with the pulsed etch gas from the inner injection zone gas feed; and forming the etch gas into a plasma to etch the layer, simultaneous with the providing the pulsed etch gas from the inner injection zone gas feed and providing the pulsed gas from the outer interjection zone gas feed, wherein the inner injection zone gas feed is above a center of the layer and wherein the inner injection zone gas feed directs the etch gas directly towards the center of the layer, and wherein the outer injection zone gas feed directs the etch gas at an acute angle with respect to the layer.

3. The method, as recited in claim 2, wherein the outer injection zone surrounds the inner injection zone.

4. The method, as recited in claim 3, wherein flow of pulsed etch gas from the inner injection zone gas feed ramps down to zero during pulsing.

5. The method, as recited in claim 4, wherein flow of pulsed etch gas from the outer injection zone gas feed ramps down to zero during pulsing.

6. The method, as recited in claim 5, further comprising a tuning gas feed wherein the tuning gas feed provides a tuning gas.

7. The method, as recited in claim 6, wherein the tuning gas is pulsed at a tuning gas frequency.

8. The method, as recited in claim 7, wherein the tuning gas frequency is different than the first frequency.

9. The method, as recited in claim 7, wherein the tuning gas frequency is the same as the first frequency.

10. The method, as recited in claim 2, wherein the outer injection zone gas feed directs the etch gas away from the center of the layer.

11. The method, as recited in claim 1, further comprising a tuning gas feed wherein the tuning gas feed provides a tuning gas.

12. The method, as recited in claim 11, wherein the tuning gas is pulsed at a tuning gas frequency, wherein the tuning gas frequency is different than the first frequency.

13. The method, as recited in claim 11, wherein the tuning gas is pulsed at a tuning gas frequency, wherein the tuning gas frequency is the same as the first frequency.

14. The method, as recited in claim 1, wherein the outer injection zone gas feed directs the etch gas away from the center of the layer.

15. The method of claim 6, wherein the tuning gas feed is vertically located below the inner injection zone gas feed and the outer injection zone gas feed.

16. The method of claim 11, wherein the tuning gas feed is vertically located below the inner injection zone gas feed and the outer injection zone gas feed.

* * * * *